(12) United States Patent
Zhang et al.

(10) Patent No.: US 9,185,761 B2
(45) Date of Patent: Nov. 10, 2015

(54) WHITE LED DEVICE HAVING LED CHIPS DIRECTLY DRIVEN BY ALTERNATING CURRENT

(75) Inventors: Hongjie Zhang, Jilin (CN); Ming Zhang, Sichuan (CN); Chengyu Li, Jilin (CN); Kun Zhao, Sichuan (CN); Dongming Li, Sichuan (CN); Li Zhang, Sichuan (CN)

(73) Assignees: Sichuan Sunfor Light Co., Ltd., Sichuan (CN); Changchun Institute of Applied Chemistry, Chinese Academy of Science, Jilin (CN)

( * ) Notice: Subject to any disclaimer, the term of this patent is extended or adjusted under 35 U.S.C. 154(b) by 267 days.

(21) Appl. No.: 13/883,832

(22) PCT Filed: Mar. 1, 2011

(86) PCT No.: PCT/CN2011/071433
§ 371 (c)(1), (2), (4) Date: May 7, 2013

(87) PCT Pub. No.: WO2012/062065
PCT Pub. Date: May 18, 2012

(65) Prior Publication Data
US 2013/0221870 A1    Aug. 29, 2013

(30) Foreign Application Priority Data

Nov. 9, 2010 (CN) .......................... 2010 1 0537984

(51) Int. Cl.
*H01J 1/62*  (2006.01)
*H01L 33/00* (2010.01)
(Continued)

(52) U.S. Cl.
CPC .......... *H05B 33/0833* (2013.01); *H01L 33/502* (2013.01); *H05B 33/0809* (2013.01); *H05B 33/0821* (2013.01)

(58) Field of Classification Search
CPC ........... H05B 33/0833; H05B 33/0821; H05B 33/0809; H01L 33/502
USPC ............. 313/498, 501–503; 257/98, 100, 103
See application file for complete search history.

(56) References Cited

U.S. PATENT DOCUMENTS 6,744,071 B2 * 6/2004 Sano et al. ....................... 257/79
6,953,952 B2 * 10/2005 Asakawa ....................... 257/103
(Continued)

FOREIGN PATENT DOCUMENTS

CN       1700484 A    11/2005
CN     201262372 Y     6/2009
(Continued)

OTHER PUBLICATIONS
International Search Report for PCT/CN2011/071433, Jan. 16, 2013.

*Primary Examiner* — Kenneth B Wells
(74) *Attorney, Agent, or Firm* — Michael Ye; Andrews Kurth LLP

(57) ABSTRACT

An Alternate Current (AC) white Light-Emitting Diode (LED) device is provided, which belongs to the technical field of white LED manufacturing. The problem to be solved by the present invention is to low-costly overcome a series of deficiencies such as the stroboflash of an AC driven LED, and the heat dissipation difficulty caused by an integrated packaging of multiple LEDs. A white LED unit includes an LED chip and a light emitting material that can emit light when being excited by the LED chip. The luminous lifetime of the light emitting material is 1-100 ms. The LED chip only comprises one PN junction. The light emitted by the LED chip is mixed with the light emitted by the light emitting material to form white light. The white LED unit is driven by AC with a frequency not more than 100 Hz. The white LED device of prevent invention uses the single PN junction chip, rather than the prior integrated packaged AC multi-LED chip.

18 Claims, 3 Drawing Sheets

(51) Int. Cl.
*H05B 33/08* (2006.01)
*H01L 33/50* (2010.01)

(56) References Cited

U.S. PATENT DOCUMENTS

| | | | | |
|---|---|---|---|---|
| 7,391,060 B2* | 6/2008 | Oshio | ............................. | 257/98 |
| 7,420,218 B2* | 9/2008 | Nagai | ............................. | 257/98 |
| 7,489,086 B2* | 2/2009 | Miskin et al. | ............. | 315/185 R |
| 7,646,032 B2* | 1/2010 | Radkov et al. | .................. | 257/89 |
| 7,902,568 B2* | 3/2011 | Morikawa et al. | ............ | 257/100 |
| 7,952,110 B2* | 5/2011 | Haase | ............................. | 257/98 |
| 7,989,236 B2* | 8/2011 | Yamaguchi et al. | ............ | 438/26 |
| 8,062,549 B2* | 11/2011 | Nagatomi et al. | ...... | 252/301.4 F |
| 8,076,680 B2* | 12/2011 | Lee et al. | ........................ | 257/88 |
| 8,089,093 B2* | 1/2012 | Matsumura et al. | .......... | 257/101 |
| 8,188,687 B2* | 5/2012 | Lee et al. | ...................... | 315/323 |
| 8,384,105 B2* | 2/2013 | Tetz et al. | ........................ | 257/98 |
| 8,461,765 B2* | 6/2013 | Liang et al. | ................ | 315/185 R |
| 8,648,539 B2* | 2/2014 | Miskin et al. | ............ | 315/185 R |
| 8,803,171 B2* | 8/2014 | Bierhuizen et al. | ............. | 257/98 |
| 8,866,402 B2* | 10/2014 | Yang | ............................. | 315/291 |
| 8,969,899 B2* | 3/2015 | Watkins et al. | ................ | 257/98 |

FOREIGN PATENT DOCUMENTS

| | | |
|---|---|---|
| KR | 20090044788 A | 5/2009 |
| WO | 2006118389 A1 | 11/2006 |
| WO | 2008/096301 A1 | 8/2008 |

* cited by examiner

WHITE LED DEVICE HAVING LED CHIPS DIRECTLY DRIVEN BY ALTERNATING CURRENT

CROSS REFERENCES TO RELATED APPLICATIONS

This utility application claims the benefit under 35 U.S.C. §371 of International Application PCT/CN2011/071433 filed on Mar. 1, 2011 which in turn takes its priority from Chinese Application No. CN 201010537984.9 filed on Nov. 9, 2010 and all of whose entire disclosures are incorporated by reference herein.

FIELD OF THE INVENTION

The present invention relates to an Alternating Current (AC) white Light-Emitting Diode (LED) device, which belongs to the technical field of white LED manufacturing, and particularly, to an AC white LED device made of a light emitting material having a specific lifetime.

BACKGROUND OF THE INVENTION

Currently, the LED is used in the fields of illumination, display, backlight, etc., and attracts extensive attention due to its advantages such as energy saving, durability and being pollution free. There are many solutions for implementing the white LED, and presently the most mature technical solution for manufacturing the white LED is to implement white light emission by combining the blue light LED chip with the yellow fluorescent powder. *Appl. Phys. Lett.* published in 1967 (refer to volume 11, page 53) reports a light emitting material $Y_3Al_5O_{12}:Ce^{3+}$ which emits yellow light, with a maximum light emitting wavelength of 550 nm and a lifetime less than 100 ns. *Appl. Phys. A* published in 1997 (refer to volume 64, page 417) reports that white light emission of an LED is implemented using the yellow light emitted by $Y_3Al_5O_{12}:Ce^{3+}$ and blue light gallium nitride, which is the most mature technical solution for manufacturing the white LED at present. But in practical applications, with the increase of the temperature of the working device, the luminous intensities of the blue light LED chip and the fluorescent powder decrease, wherein the luminous intensity of the fluorescent powder decreases obviously, thus the usage of the LED is influenced.

The conventional LED is driven by the direct current (DC), but most of the household, industrial, commercial or public electricity is supplied in the form of AC, thus a rectifier transformer must be accompanied for AC-DC conversion when the LED is used for illumination, etc. But in the process of AC-DC conversion, a power loss up to 15~30% will be caused. In addition, the conversion device has a short lifetime and a high cost, while it requires a lot of works and time in installation, so the efficiency is low.

The American patent U.S. Pat. No. 7,489,086 B2 "AC LIGHT EMITTING DIODE AND AC LED DRIVE METHODS AND APPARATUS" provides an AC LED device, which mainly enables an integrated packaged LED device to work in a frequency higher than 100 Hz, so as to compensate for the stroboflash of light emission of the LED device in the AC working state with a visual persistence effect of naked eyes. The Chinese patent No. 200910307357.3 discloses a light emitting material $Y_2O_3 \cdot Al_2O_3 \cdot SiO_2:Ce \cdot B \cdot Na \cdot P$ with yellow long afterglow phenomenon and a white LED device using the same.

The Chinese patent CN100464111C discloses an AC LED lamp using LED chips of different emitting colors connected in parallel in an AC power supply, and it mainly describes different colors of LED chips used together for emitting white light, and the specific circuit thereof, such as red, green and blue light emitting chips. The international patent WO2004/023568A1 "LIGHT-EMITTING DEVICE HAVING LIGHT-EMITTING ELEMENTS" proposes to install a plurality of small LED chip arrays on a sapphire substrate, so as to provide a light emitting device that can be driven by an AC power supply. On the basis of similar ideas, the Seoul Semiconductor of South Korea and the Industrial Technology Research Institute of Taiwan integratedly package a lot of superfine LED grains onto a substrate referred to as AC LED chip. The core of the above AC LED technology is the microelectronic circuit processing technology integratedly packaging a lot of micro grains, e.g., the AC LED chip manufactured by the Industrial Technology Research Institute of Taiwan integratedly packages hundreds of tiny LEDs in an area of 1 $mm^2$. But it is difficult to process the AC LED chip, and problems such as poor heat dissipation will be caused as the large number of microchips are integrated in a narrow substrate space.

In order to enable the white LED device to overcome the stroboflash under the AC power supply mode and improve the heat dissipation, persons skilled in the art always make unremitting efforts.

SUMMARY OF THE INVENTION

The technical problem to be solved by the present invention is to provide a new white LED device, so as to overcome a series of deficiencies such as the stroboflash under the AC power supply mode and the heat dissipation difficulty of the existing white LED device.

The technical solutions of the present invention: a white Light-Emitting Diode (LED) unit, comprising an LED chip and a light emitting material capable of emitting light when being excited by the LED chip, characterized in that, the LED chip only comprises one light emitting PN junction, the luminous lifetime of the light emitting material is 1 to 100 ms, the luminous brightness of powered off chip under non-constant current condition is compensated for with afterglow of the light emitting material, and the light emitted by the LED chip is mixed with the light emitted by the light emitting material to form white light.

Further, a white LED unit, comprising an LED chip and a light emitting material capable of emitting light when being excited by the LED chip, wherein the LED chip only comprises one light emitting PN junction, the luminous lifetime of the light emitting material is 10-30 ms, and the light emitted by the LED chip is mixed with the light emitted by the light emitting material to form white light.

According to the definition of luminescence, the luminous lifetime of the light emitting material is the time for decreasing the luminous intensity of the material to be 1/e of the maximum intensity in the excitation.

The white LED unit is driven by Alternating Current (AC) with a frequency not more than 100 Hz, and preferably 50 to 60 Hz. The luminous brightness of the powered off chip under non-constant current condition may be compensated for with afterglow of the light emitting material, so that the AC driving is more practical.

The white LED unit of prevent invention overcomes the stroboflash caused by the AC power supply by using the normal single PN junction LED chip, rather than the prior AC LED chip integrating a plurality of micro grains, thus the production is simple and the cost is low.

In which, the light emitted by the LED chip is ultraviolet light in a range of 200 nm to 380 nm or visible light in a range of 380 nm to 780 nm.

In the present invention, the light emitting material emits light when being excited by the LED chip, and the overall visual effect of the emitted light is the white light, or the overall visual effect of the light emitted by the light emitting material and the light emitted by the chip is the white light.

The light emitting material is at least one of $CaS:Eu^{2+}$; $CaS:Bi^{2+}$, $Tm^{3+}$; $ZnS:Tb^{3+}$; $CaSrS_2:Eu^{2+}$, $Dy^{3+}$; $SrGa_2S_4:Dy^{3+}$; $Ga_2O_3:Eu^{3+}$; $(Y,Gd)BO_3:Eu^{3+}$; $Zn_2SiO_4:Mn^{2+}$; $YBO_3:Tb^{3+}$; $Y(V,P)O_4:Eu^{3+}$; $SrAl_2O_4:Eu^{2+}$; $SrAl_2O_4:Eu^{2+}$, $B^{3+}$; $SrAl_2O_4:Eu^{2+}$, $Dy^{3+}$, $B^{3+}$; $Sr_4Al_{14}O_{25}:Eu^{2+}$; $Sr_4Al_{14}O_{25}:Eu^{2+}$, $Dy^{3+}$, $B^{3+}$; $BaAl_2O_4:EU^{2+}$; $CaAl_2O_4:EU^{2+}$; $Sr_3SiO_5:EU^{2+}$, $Dy^{3+}$; $BaMgAl_{10}O_{17}:Eu^{2+}$, $Mn^{2+}$; $Tb(acac)_2(AA)$phen; $Y_2O_2S:Eu^{3+}$; $Y_2SiO_5:Tb^{3+}$; $SrGa_2S_4:Ce^{3+}$; $Y_3(Al,Ga)_5O_{12}:Tb^{3+}$; $Ca_2Zn_4Ti_{15}O_{36}:Pr^{3+}$; $CaTiO_3:Pr^{3+}$; $Zn_2P_2O_7:Tm^{3+}$; $Ca_2P_2O_7:Eu^{2+}$, $Y^{3+}$; $Sr_2P_2O_7:Eu^{2+}$, $Y^{3+}$; $Lu_2O_3:Tb^{3+}$; $Sr_2Al_6O_{11}:Eu^{2+}$; $Mg_2SnO_4:Mn^{2+}$; $CaAl_2O_4:Ce^{3+}$, $Tb^{3+}$; $Sr_4Al_{14}O_{25}:Tb^{3+}$; $Ca_{10}(PO_4)_6(F,Cl)_2:Sb^{3+}$, $Mn^{2}$; $Sr_2MgSi_2O_7:Eu^{2+}$; $Sr_2CaSi_2O_7:Eu^{2+}$; $Zn_3(PO4)_2:Mn^{2+}$, $Ga^{3+}$; $CaO:Eu^{3+}$; $Y_2O_2S:Mg^{2+}$, $Ti^{3+}$; $Y_2O_2S:Sm^{3+}$; $SrMg_2(PO_4)_2:Eu^{2+}$, $Gd^{3+}$; $BaMg_2(PO_4)_2:Eu^{2+}$, $Gd^{3+}$; $Zn_2SiO_4:Mn^{2+},As^{5+}$; $CdSiO_3:Dy^{3+}$; $MgSiO_3:Eu^{2+}$ and $Mn^{2+}$.

The preferable light emitting material is at least one of $Ca_2P_2O_7:Eu^{2+}$, $Y^{3+}$; $Sr_2P_2O_7:Eu^{2+}$, $Y^{3+}$; $Sr_4Al_{14}O_{25}:Eu^{2+}$, $Dy^{3+}$, $B^{3+}$; $SrAl_2O_4:Eu^{2+}$, $Dy^{3+}$, $B^{3+}$; $Zn_2SiO_4:Mn^{2+}$, $As^{5+}$; $Zn_2P_2O_7:Tm^{3+}$; $Y_2O_2S:Eu^{3+}$; $Sr_4Al_{14}O_{25}:Tb^{3+}$; $Zn_3(PO_4)_2:Mn^{2+}$, $Ga^{3+}$; and $CaS:Eu^{2+}$.

In the white LED unit of the present invention, each LED chip only comprises one light emitting PN junction.

The white LED device of the present invention comprises the white LED unit and a drive circuit. The AC driven drive circuit is a unidirectional series circuit, a reverse parallel circuit or a bridge rectifier circuit, as illustrated in FIGS. 1 to 4, or arbitrary combinations thereof. The frequency of the AC driven drive circuit is not more than 100 Hz.

In addition, the white LED device of the present invention further comprises a light guide covering layer, which is a non-planar light guide structure. Through the light guide covering layer, the light emitted by the LED chip and the light emitted by the light emitting material is reflected, refracted, diffused, dodged and finally mixed to output uniform light.

In which, the light guide covering layer is a lens or other transparent covering layer, which can be doped with particles of non-light-emitting material with a diameter less than 5 µm, so that the light from the chip is diffused more uniformly.

The present invention has the following beneficial effects:

The prior white LED device uses YAG:Ce as the light emitting material, which will cause stroboflash phenomenon due to the change of AC cycle at a power frequency below 100 Hz. The present invention can maintain the light emission when the excitation light source disappears since the light emitting material having a specific lifetime is used, thus in an AC white LED device based on the solution of the present invention, when the current cycle changes, the light emission of the light emitting material can be maintained for a certain time in the cycle, thereby compensating for the stroboflash of the LED chip caused by the AC fluctuation, and keeping a stable light output from the white LED device in the AC cycle. In addition, as the LED chip does not work in a half of the AC cycle, the heat effect is decreased, which is beneficial to overcome series of difficulties caused by the chip heating in the prior white LED device.

Figure 1:
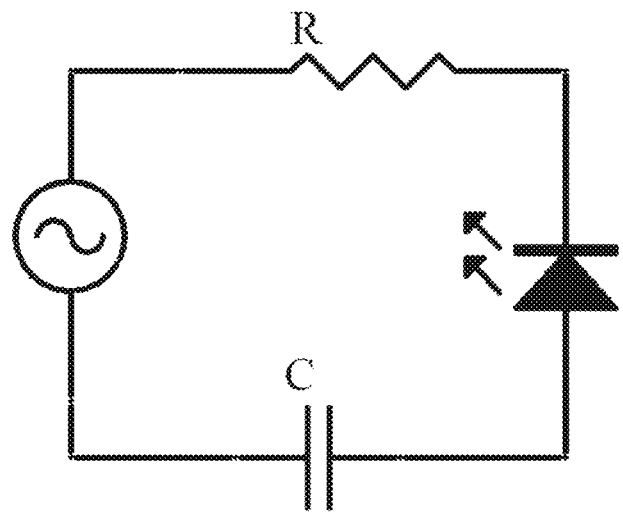
FIG. 1 illustrates a schematic diagram of a unidirectional series circuit of an AC white LED device of the present invention.
Figure 2:
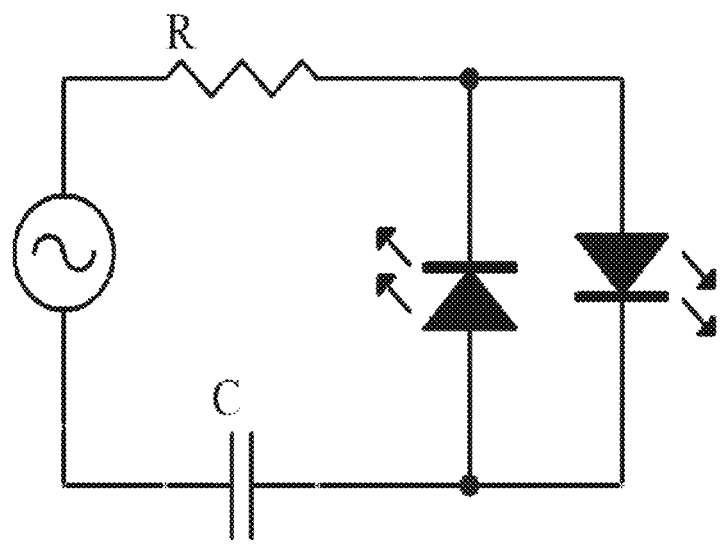
FIG. 2 illustrates a schematic diagram of a reverse parallel circuit of an AC white LED device of the present invention.
Figure 3:
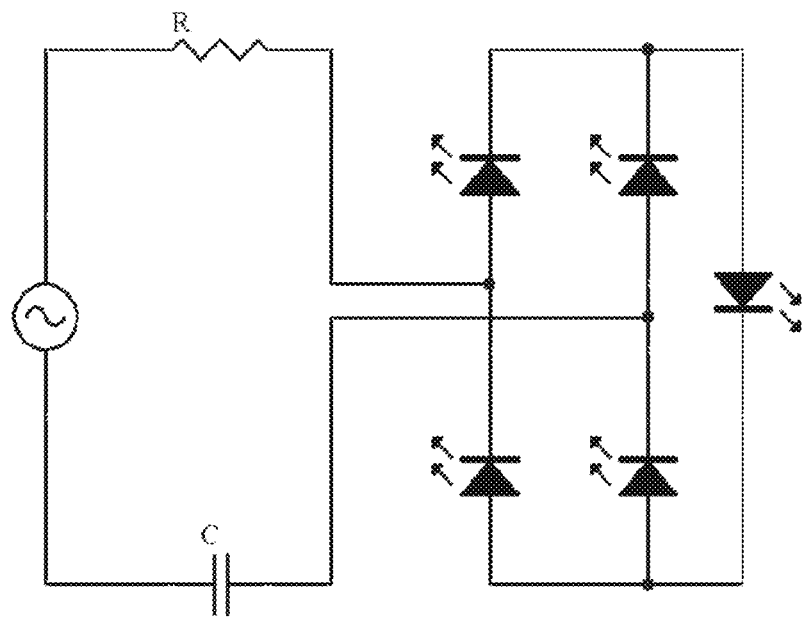
FIG. 3 illustrates a schematic diagram of a bridge rectifier circuit having a normal conducted LED chip of an AC white LED device of the present invention.
Figure 4:
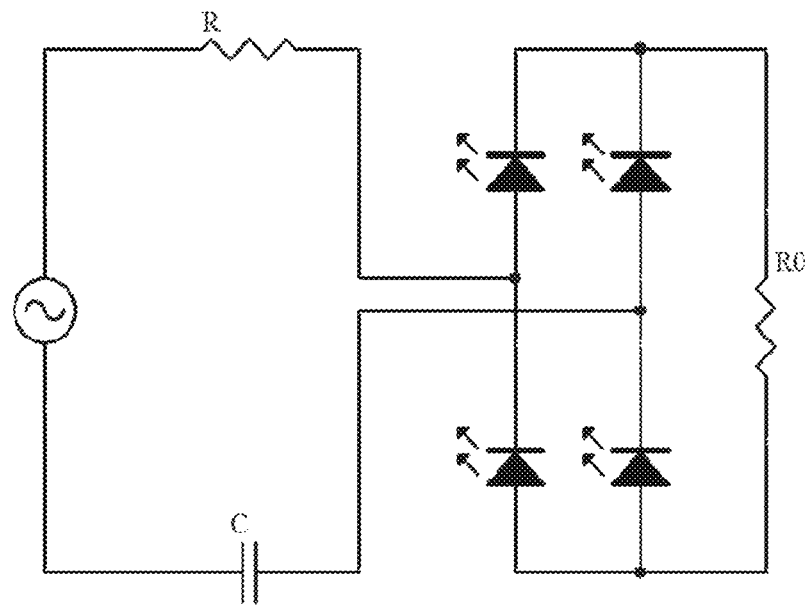
FIG. 4 illustrates a schematic diagram of a bridge rectifier circuit having no normal conducted LED chip of an AC white LED device of the present invention.

The above contents of the present invention are further described in details through the following embodiments. But it shall not be appreciated that the range of the subject matter of the present invention is limited thereto. Any technology implemented based on the above contents of the present invention shall fall within the range of the present invention. Particularly, about the constitution of the basic circuit, the embodiments of the present invention only give the simplest reverse parallel circuit, but the AC white LED device of the present invention is not limited thereto, and it further includes for example a unidirectional series circuit and a bridge rectifier circuit.

DETAILED DESCRIPTION OF THE PREFERRED EMBODIMENTS

Examples 1 to 8 overcome the stroboflash by implementing the white LED device made of a light emitting material shown in Table 1 and merchant normal LED chip in a general packaging technology, without using integrated chip dedicated to the AC LED.

Examples 1 to 8

TABLE 1

| Example | LED chip (light emitting wavelength) | Light emitting material | Lifetime of light emitting material (ms) |
|---|---|---|---|
| 1 | Ultraviolet (254 nm) | 45 wt % $Zn_2P_2O_7$: $Tm^{3+}$<br>55 wt % $Zn_3(PO4)_2$: $Mn^{2+}$, $Ga^{3+}$ | 10 |
| 2 | Ultraviolet (254 nm) | $CaAl_2O_4$: $Dy^{3+}$ | 25 |
| 3 | Ultraviolet (310 nm) | 15 wt % $Sr_2P_2O_7$: $Eu^{2+}$, $Y^{3+}$<br>30 wt % $Sr_4Al_{14}O_{25}$: $Eu^{2+}$, $Dy^{3+}$, $B^{3+}$<br>15 wt % $Ca_4O(PO_4)_2$: $Eu^{2+}$,<br>40 wt % $Zn_3(PO_4)_2$: $Mn^{2+}$, $Ga^{3+}$ | 30 |

TABLE 1-continued

| Example | LED chip (light emitting wavelength) | Light emitting material | Lifetime of light emitting material (ms) |
|---|---|---|---|
| 4 | Ultraviolet (365nm) | 10 wt % $Sr_2P_2O_7$: $Eu^{2+}$, $Y^{3+}$<br>30 wt % $Sr_4Al_{14}O_{25}$: $Eu^{2+}$<br>60 wt % $Y_2O_2S$: $Eu^{3+}$ | 14 |
| 5 | Purple light (400 nm) | 50 wt % $SrMg_2(PO_4)_2$: $Eu^{2+}$, $Gd^{3+}$<br>50 wt % $Ca_4O(PO_4)_2$: $Eu^{2+}$ | 4 |
| 6 | Purple light (400 nm) | 40 wt % $Sr_4Al_{14}O_{25}$: $Eu^{2+}$<br>60 wt % $Y_2O_2S$: $Eu^{3+}$ | 1 |
| 7 | Blue light (450 nm) | 30 wt % $SrAl_2O_4$: $Eu^{2+}$, $B^{3+}$<br>70 wt % CaS: $Eu^{2+}$ | 100 |
| 8 | Blue light (460 nm) | 60 wt % $Y_2O_2S$: $Mg^{2+}$, $Ti^{3+}$<br>40 wt % $SrAl_2O_4$: $Eu^{2+}$ | 48 |

Test Example 1

Luminescence Properties of the AC White LED Device of the Present Invention

Table 2 shows the luminous brightness of the photos shot within 20 ms by the AC white LED device driven under 50 Hz AC using a high-speed scientific camera Sarnoff CAM512 which takes 300 photos per second. Reference 1 is an AC driven white LED device made in the same manner as examples 1 to 8 using the merchant 460 nm blue light chip packaged with a yellow light emitting material YAG:Ce (the luminous lifetime is 100 ns). Reference 2 is an AC driven white LED device made in the same manner as examples 1 to 8 using the merchant 460 nm blue light chip packaged with long lifetime materials SrA1204:Eu, Dy and Y2O2S:Eu, Mg, Ti (the luminous lifetime is more than 1 s). In table 2, the brightness data is relative brightness without dimension.

TABLE 2

| | Time | | | | | |
|---|---|---|---|---|---|---|
| | 3.33 ms | 6.66 ms | 9.99 ms | 13.32 ms | 16.65 ms | 19.98 ms |
| Brightness of reference 1 | 2265 | 3466 | 0 | 2153 | 3570 | 0 |
| Brightness of reference 2 | 746 | 998 | 670 | 702 | 965 | 712 |
| Brightness of example 1 | 2931 | 3025 | 1455 | 3187 | 3443 | 1665 |
| Brightness of example 2 | 3140 | 3373 | 1654 | 2884 | 3437 | 1877 |
| Brightness of example 3 | 3200 | 3423 | 1506 | 3135 | 3362 | 1656 |
| Brightness of example 4 | 2910 | 3190 | 1652 | 2723 | 3245 | 1850 |
| Brightness of example 5 | 2250 | 2734 | 1468 | 2114 | 2800 | 1420 |
| Brightness of example 6 | 2109 | 2636 | 1150 | 2213 | 2858 | 1163 |
| Brightness of example 7 | 2017 | 2420 | 1569 | 2115 | 2654 | 1510 |
| Brightness of example 8 | 1879 | 2000 | 1270 | 1746 | 2123 | 1303 |

Table 3 gives the normalized value of the maximum luminous brightness of each sample in the examples of Table 2.

TABLE 3

| Normalized brightness ratio | Time | | | | | |
|---|---|---|---|---|---|---|
| | 3.33 ms | 6.66 ms | 9.99 ms | 13.32 ms | 16.65 ms | 19.98 ms |
| Reference 1 | 0.63445 | 0.97087 | 0 | 0.60308 | 1 | 0 |
| Reference 2 | 0.74749 | 1 | 0.67134 | 0.70341 | 0.96693 | 0.71343 |
| Example 1 | 0.85129 | 0.87859 | 0.4226 | 0.92565 | 1 | 0.48359 |
| Example 2 | 0.91359 | 0.98138 | 0.48123 | 0.8391 | 1 | 0.54612 |
| Example 3 | 0.93485 | 1 | 0.43996 | 0.91586 | 0.98218 | 0.48379 |
| Example 4 | 0.89676 | 0.98305 | 0.50909 | 0.83914 | 1 | 0.57011 |
| Example 5 | 0.80357 | 0.97643 | 0.52429 | 0.755 | 1 | 0.50714 |
| Example 6 | 0.73793 | 0.92232 | 0.40238 | 0.77432 | 1 | 0.40693 |
| Example 7 | 0.75998 | 0.91183 | 0.59118 | 0.79691 | 1 | 0.56895 |
| Example 8 | 0.88507 | 0.94206 | 0.59821 | 0.82242 | 1 | 0.61375 |

As can be seen from Tables 2 and 3, the luminescence of the present invention is stable and slightly fluctuant in the AC cycle. But about reference 1, i.e., a white LED device made of the merchant blue light chip packaged with the conventional yellow light emitting material YAG:Ce having a short luminous lifetime, the luminescence is unstable and largely fluctuant in the AC cycle. It is clear that the present invention effectively and low-costly overcomes the stroboflash of the AC LED.

Although as illustrated by reference 2, the luminescence of the white LED device made of the light emitting material with long luminous lifetime is also slightly fluctuant in the AC cycle, the energy obtained by the material when the exciting light exists cannot be released quickly, so the light is weak (refer to Table 1), which is disadvantageous to be used as a light emitting material.

Table 4 shows the color coordinates and the color temperatures of the examples in Table 1 (measured using Minolta colorimeter CS-100A).

TABLE 4

CIE Color Coordinates and Color Temperatures

| Color Coordinates | CIEx | CIEy | Related color temperature |
|---|---|---|---|
| Example 1 | 0.4076 | 0.3807 | 3312K |
| Example 2 | 0.3410 | 0.3102 | 4997K |
| Example 3 | 0.3279 | 0.2939 | 5725K |
| Example 4 | 0.3320 | 0.3210 | 5496K |
| Example 5 | 0.3802 | 0.3566 | 3815K |
| Example 6 | 0.3503 | 0.3002 | 4441K |
| Example 7 | 0.3104 | 0.3154 | 6746K |
| Example 8 | 0.3484 | 0.3516 | 4867K |

Figure 6:
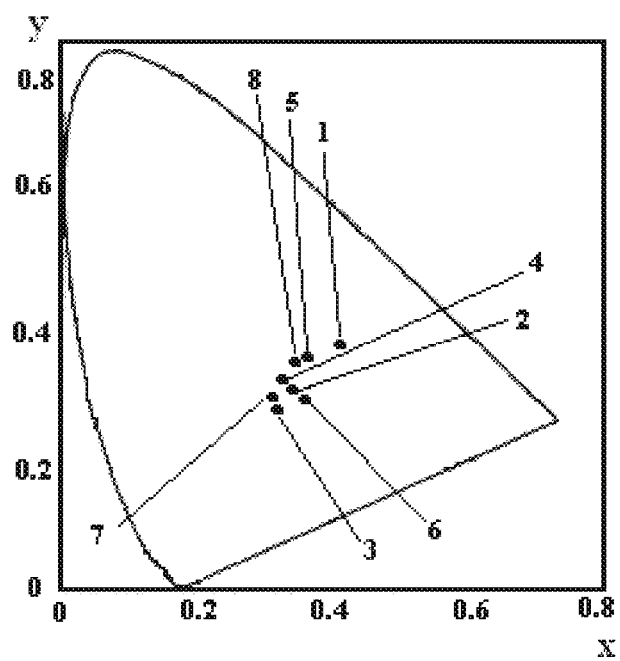
FIG. 6 illustrates color points of Examples 1 to 8 in CIE1931 chromatic diagram, wherein digits 1 to 8 are corresponding to Examples 1 to 8, respectively.

As can be seen from Table 4, the above examples enable the white LED device to emit white light. The color point positions in the light emissions of respective examples in the CIE1931 chromaticity diagram are shown in FIG. 6.

Test Example 2

Light Attenuation of the AC White LED Device of the Present Invention

Figure 5:
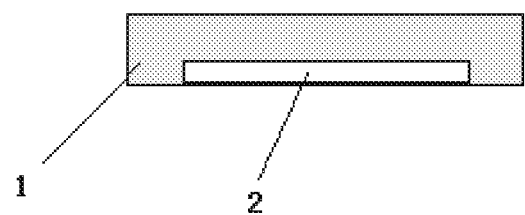
FIG. 5 illustrates a schematic diagram of the constitution of a white LED unit, wherein 1 represents a light emitting material or a light emitting layer made of the light emitting material and a transparent medium, and 2 represents an LED chip.

Table 5 shows the light attenuation data of examples 1 to 18 and the reference. The reference is a white LED device obtained by installing a white LED chip made of the merchant 460 nm blue light chip packaged with YAG:Ce in the general DC power supply mode at present. The test method is as follows: electrifying the AC white LED device of the example and the reference device, and measuring their luminous brightness in a certain interval with Minolta colorimeter CS-100. The results are shown in FIG. 5. The data in FIG. 5 is relative brightness without dimension, and the initial data is normalized.

TABLE 5

| Time | 1 h | 1,000 h | 1,500 h | 2,500 h |
|---|---|---|---|---|
| Brightness of reference | 100 | 98 | 97.1 | 96.3 |
| Brightness of example 1 | 100 | 99.8 | 99.5 | 99.1 |
| Brightness of example 2 | 100 | 99.5 | 99.4 | 99.3 |
| Brightness of example 3 | 100 | 99.6 | 99.5 | 99 |
| Brightness of example 4 | 100 | 99.7 | 99.3 | 99 |
| Brightness of example 5 | 100 | 99.8 | 99.4 | 98.6 |
| Brightness of example 6 | 100 | 99.5 | 99 | 98 |
| Brightness of example 7 | 100 | 99.4 | 99 | 98.3 |
| Brightness of example 8 | 100 | 99.3 | 99 | 98 |

As can be seen from the data in FIG. 5, the AC white LED device of the present invention has a light attenuation less than the AC white LED device in the prior art.

What is claimed is:

1. A white Light-Emitting Diode (LED) device, said LED device comprising: an LED chip and a light emitting material capable of emitting light when excited by said LED chip, said LED chip comprising a single light emitting PN junction, and wherein said LED chip is driven directly by Alternating Current (AC) with a frequency of not more than 100 Hz, wherein a luminous lifetime of the light emitting material is 1 to 100 ms, wherein a luminous brightness under a non-constant current condition is compensated for through afterglow of the light emitting material, and wherein light emitted by the LED chip is mixed with light emitted by the light emitting material to form white light, wherein said light emitting material is selected from the group consisting of (1) a combination of $Zn_2P_2O_7:Tm^{3+}$; and $Zn_3(PO_4)_2:Mn^{2+}, Ga^{3+}$;
  (2) $CaAl_2O_4:Dy^{3+}$;
  (3) a combination of $Sr_2P_2O_7:Eu^{2+},Y^{3+}$; $Sr_4Al_{14}O_{25}:Eu^{2+},Dy^{3+}, B^{3+}$; $Ca_4O(PO_4)_2:Eu^{2+}$; and $Zn_3(PO_4)_2:Mn^{2+}, Ga^{3+}$;
  (4) a combination of $Sr_2P_2O_7:Eu^{2+},Y^{3+}$; $Sr_4Al_{14}O_{25}:Eu^{2+}$; and $Y_2O_2S:Eu^{3+}$;
  (5) a combination of $SrMg_2(PO_4)_2:Eu^{2+}, Gd^{3+}$; and $Ca_4O(PO_4)_2:Eu^{2+}$;
  (6) a combination of $Sr_4Al_{14}O_{25}:Eu^{2+}$; and $Y_2O_2S:Eu^{3+}$;
  (7) a combination of $SrAl_2O_4:Eu^{2+}, B^{3+}$; and $CaS:Eu^{2+}$;
  (8) a combination of $Y_2O_2S:Mg^{2+}, Ti^{3+}$; and $SrAl_2O_4:Eu^{2+}$.

2. The white LED device according to claim 1, the wherein said LED chip is driven by Alternating Current (AC) with a frequency of 50 to 60 Hz.

3. The white LED device according to claim 2, wherein said luminous lifetime of the light emitting material is 10 to 30 ms.

4. The white LED device according to claim 1, wherein said light emitting material is selected from the group consisting of (1) 45 wt % $Zn_2P_2O_7:Tm^{3+}$; and 55 wt % $Zn_3(PO_4)_2:Mn^{2+}, Ga^{3+}$;
  (2) $CaAl_2O_4:Dy^{3+}$;
  (3) 15 wt % $Sr_2P_2O_7:Eu^{2+},Y^{3+}$; 30 wt % $Sr_4Al_{14}O_{25}:Eu^{2+},Dy^{3+}, B^{3+}$; 15 wt % $Ca_4O(PO_4)_2:Eu^{2+}$; and 40 wt % $Zn_3(PO_4)_2:Mn^{2+}, Ga^{3+}$;
  (4) 10 wt % $Sr_2P_2O_7:Eu^{2+},Y^{3+}$; 30 wt % $Sr_4Al_{14}O_{25}:Eu^{2+}$; and 60 wt % $Y_2O_2S:Eu^{3+}$;
  (5) 50 wt % $SrMg_2(PO_4)_2:Eu^{2+}, Gd^{3+}$; and 50 wt % $Ca_4O(PO_4)_2:Eu^{2+}$;
  (6) 40 wt % $Sr_4Al_{14}O_{25}:Eu^{2+}$; and 60 wt % $Y_2O_2S:Eu^{3+}$;
  (7) 30 wt % $SrAl_2O_4:Eu^{2+}, B^{3+}$; and 70 wt % $CaS:Eu^{2+}$; and
  (8) 60 wt % $Y_2O_2S:Mg^{2+}, Ti^{3+}$; and 40 wt % $SrAl_2O_4:Eu^{2+}$.

5. The white LED device according to claim 2, wherein said light emitted by the LED chip is ultraviolet light in a range of 200 nm to 380 nm or visible light in a range of 380 nm to 780 nm.

6. The white LED device according to claim 1, further comprising a driving circuit, wherein said driving circuit comprises a circuit selected from the group consisting of a unidirectional series circuit, a reverse parallel circuit and a bridge rectifier circuit.

7. The white LED device according to claim 6, further comprising a light guide covering layer.

8. The white LED device according to claim 7, wherein the light guide covering layer is doped with particles of non-light-emitting material with a diameter less than 5 µm.

9. The white LED device of claim 1, further comprising an AC driving circuit and at least one white LED chip, wherein said driving circuit comprises combinations of a unidirectional series circuit, a reverse parallel circuit and a bridge rectifier circuit.

10. The white LED device of claim 6, wherein said driving circuit is a reverse parallel circuit and wherein every diode used in said driving circuit is a LED.

11. The white LED device of claim 6, wherein said driving circuit is a bridge rectifier circuit and wherein every diode used in said driving circuit is a LED.

12. A method of generating white light using a light emitting diode (LED) chip, said method comprising:
providing a LED chip comprising a single PN junction;
associating said LED chip with a light emitting material which is capable of emitting light when excited by said LED chip, and wherein said light emitting material comprises a luminous lifetime of 1 to 100 ms and wherein said light emitting material comprises a luminous brightness under a non-constant current condition that is compensated for by an afterglow of said light emitting material; and
directly driving said LED chip using an alternating current (AC) with a frequency of no more than 100 Hz,
wherein said light emitting material is selected from the group consisting of (1) a combination of $Zn_2P_2O_7$:$Tm^{3+}$; and $Zn_3(PO_4)_2$:$Mn^{2+}$, $Ga^{3+}$;

(2) $CaAl_2O_4$:$Dy^{3+}$;
(3) a combination of $Sr_2P_2O_7$:$Eu^{2+}$, $Y^{3+}$; $Sr_4Al_{14}O_{25}$:$Eu^{2+}$, $Dy^{3+}$, $B^{3+}$; $Ca_4O(PO_4)_2$:$Eu^{2+}$; and $Zn_3(PO_4)_2$:$Mn^{2+}$, $Ga^{3+}$;
(4) a combination of $Sr_2P_2O_7$:$Eu^{2+}$, $Y^{3+}$; $Sr_4Al_{14}O_{25}$:$Eu^{2+}$; and $Y_2O_2S$:$Eu^{3+}$;
(5) a combination of $SrMg_2(PO_4)_2$:$Eu^{2+}$, $Gd^{3+}$; and $Ca_4O(PO_4)_2$:$Eu^{2+}$;
(6) a combination of $Sr_4Al_{14}O_{25}$:$Eu^{2+}$; and $Y_2O_2S$:$Eu^{3+}$;
(7) a combination of $SrAl_2O_4$:$Eu^{2+}$, $B^{3+}$; and $CaS$:$Eu^{2+}$;
(8) a combination of $Y_2O_2S$:$Mg^{2+}$, $Ti^{3+}$; and $SrAl_2O_4$:$Eu^{2+}$.

13. The method of claim 12, wherein said step of exciting said LED chip comprises using AC with a frequency of 50 to 60 Hz.

14. The method of claim 13 wherein said luminous lifetime of the light emitting material is 10 to 30 ms.

15. The method of claim 12, wherein said light emitting material is selected from the group consisting of (1) 45 wt % $Zn_2P_2O_7$:$Tm^{3+}$; and 55 wt % $Zn_3(PO_4)_2$:$Mn^{2+}$, $Ga^{3+}$;
(2) $CaAl_2O_4$:$Dy^{3+}$;
(3) 15 wt % $Sr_2P_2O_7$:$Eu^{2+}$, $Y^{3+}$; 30 wt % $Sr_4Al_{14}O_{25}$:$Eu^{2+}$, $Dy^{3+}$, $B^{3+}$; 15 wt % $Ca_4O(PO_4)_2$:$Eu^{2+}$; and 40 wt % $Zn_3(PO_4)_2$:$Mn^{2+}$, $Ga^{3+}$;
(4) 10 wt % $Sr_2P_2O_7$:$Eu^{2+}$, $Y^{3+}$; 30 wt % $Sr_4Al_{14}O_{25}$:$Eu^{2+}$; and 60 wt % $Y_2O_2S$:$Eu^{3+}$;
(5) 50 wt % $SrMg_2(PO_4)_2$:$Eu^{2+}$, $Gd^{3+}$; and 50 wt % $Ca_4O(PO_4)_2$:$Eu^{2+}$;
(6) 40 wt % $Sr_4Al_{14}O_{25}$:$Eu^{2+}$; and 60 wt % $Y_2O_2S$:$Eu^{3+}$;
(7) 30 wt % $SrAl_2O_4$:$Eu^{2+}$, $B^{3+}$; and 70 wt % $CaS$:$Eu^{2+}$;
(8) 60 wt % $Y_2O_2S$:$Mg^{2+}$, $Ti^{3+}$; and 40 wt % $SrAl_2O_4$:$Eu^{2+}$.

16. The method of claim 12, wherein said light emitted by the LED chip is ultraviolet light in a range of 200 nm to 380 nm or visible light in a range of 380 nm to 780 nm.

17. The method of claim 12, further comprising the step of covering said LED chip and said light emitting material with a light guide covering layer.

18. The method of claim 17, wherein said step of covering said LED chip and said light emitting material comprises doping said light guide covering layer with particles of non-light-emitting material with a diameter less than 5 µm.

* * * * *